(12) United States Patent
Takeuchi et al.

(10) Patent No.: US 6,378,762 B1
(45) Date of Patent: Apr. 30, 2002

(54) CREAM SOLDER APPARATUS AND PRINTING METHOD THEREFOR

(75) Inventors: Masao Takeuchi; Yoshiharu Fujimori; Chuji Tomita, all of Nagano (JP)

(73) Assignee: Athlete FA Corporation, Suwa (JP)

( * ) Notice: Subject to any disclaimer, the term of this patent is extended or adjusted under 35 U.S.C. 154(b) by 0 days.

(21) Appl. No.: 09/599,794

(22) Filed: Jun. 22, 2000

(51) Int. Cl.[7] ................................................ B23K 31/00
(52) U.S. Cl. ................................ 228/248.1; 228/180.1; 228/33
(58) Field of Search .................... 228/248.1, 180.22, 228/180.1, 215, 4.1, 39, 260, 257, 33; 101/114; D23/213

(56) References Cited

U.S. PATENT DOCUMENTS

| | | | |
|---|---|---|---|
| 1,754,382 A | * 4/1930 | Baracate |
| 2,766,482 A | * 10/1956 | Heibel |
| 5,242,254 A | * 9/1993 | Harold |
| 5,244,143 A | * 9/1993 | Ference et al. |
| 5,445,313 A | * 8/1995 | Boyd et al. |
| 5,565,033 A | * 10/1996 | Gaynes et al. |
| 5,626,277 A | * 5/1997 | Kawada |
| 5,655,704 A | * 8/1997 | Sakemi et al. |
| 5,913,985 A | * 6/1999 | Lei et al. |
| 5,947,022 A | * 9/1999 | Freeman et al. |
| 5,971,058 A | * 10/1999 | Bolde et al. |
| 6,114,098 A | * 9/2000 | Appelt et al. |
| 6,126,059 A | * 10/2000 | MacKay et al. |
| 6,150,726 A | * 11/2000 | Feilchenfeld et al. |
| 6,231,333 B1 | * 5/2001 | Gruber et al. |

* cited by examiner

Primary Examiner—Tom Dunn
Assistant Examiner—Colleen Cooke
(74) Attorney, Agent, or Firm—Hogan & Hartson, L.L.P.

(57) ABSTRACT

A cream solder printing apparatus is disclosed which includes a positioning unit for positioning a workpiece 1, a mask 9 having a plurality of opening portions 31, a filling unit for filling cream solder 11 in the opening positions, a pressurizing unit composed of a pressure head 12 having a pressure container 13 and a gas charge/discharge pipe 14, a position registration unit for aligning the workpiece, the mask and the pressure head, and a moving means for peeling the mask away from the workpiece. A lower surface 27 of said pressure head has holes at positions corresponding to the opening portions.

15 Claims, 8 Drawing Sheets

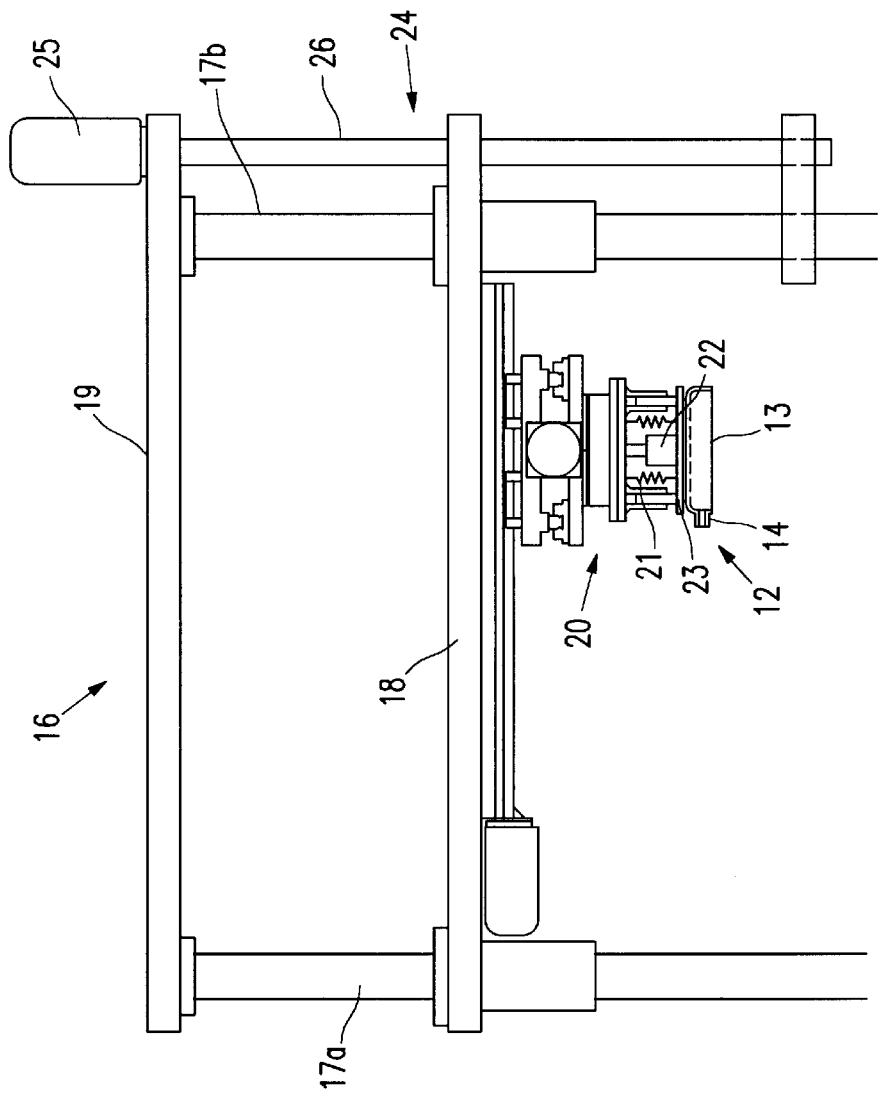
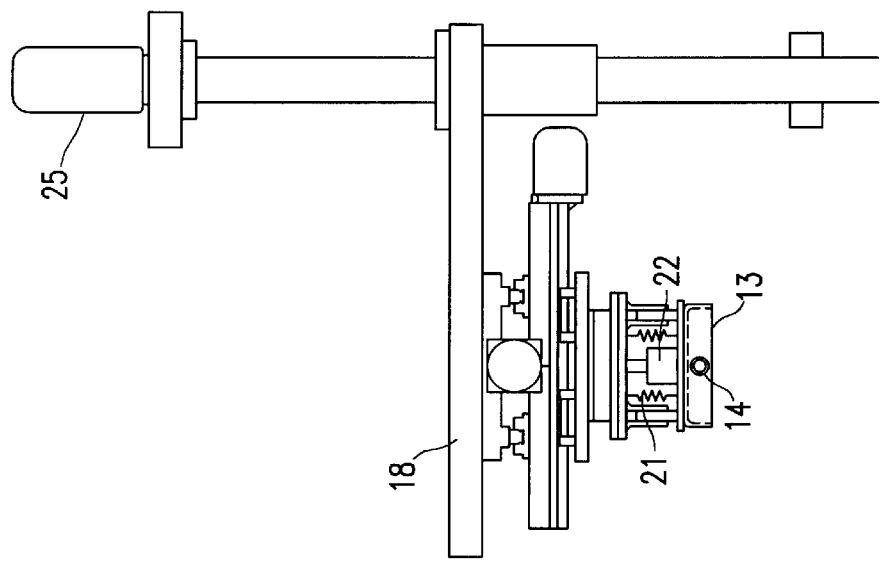
FIG. 2B
FIG. 2A

CREAM SOLDER APPARATUS AND PRINTING METHOD THEREFOR

BACKGROUND OF THE INVENTION

1. Field of the Invention

The present invention relates to a method and apparatus for printing cream solder on a workpiece.

2. Description of the Related Art

In a conventional cream solder printing apparatus and method, a poor printing plate removal property causes cream solder to be left at an opening portion provided in a mask, if a ratio of a depth of the opening portion to a diameter of the opening portion (hereinafter referred to as an aspect ratio of the opening portion) is not smaller than 0.3. For example, in the case where the mask is 0.1 mm thick, if the opening diameter is not greater than 0.3 mm, the cream solder remains there, and even in the case where the mask is 0.4 mm thick, if the opening diameter is 1 mm, the cream solder remains there.

As a method for improving the printing plate removal property, there is a known printing apparatus in which a pin corresponding to the opening portion of the mask is provided above the mask so that the cream solder filled in the opening portion is pushed downwardly (for example, see Japanese Patent Application Laid-open No. Hei 6-238865). In addition, a screen printing method and a screen printing apparatus for improving the printing plate removal property have been proposed in which an internal pressure (air pressure) of an upper sealed portion of the mask is temporarily increased when or before the substrate is separated away from the mask during the printing process, resulting in a good shape printing property (see Japanese Patent Application Laid-open No. Hei 7-9658).

The conventional method for improving the printing plate removal property of the cream solder in which the cream solder, filled in the mask opening portions is pushed out by pins or the like, suffers from a disadvantage that it is difficult to suitably adjust the clearance between the opening portions and the pins in the case where there are dozens of pins or the diameter of the opening portions is small.

FIG. 7A shows the conventional case disclosed in Japanese Patent Application Laid-open No. Hei 7-9658. Reference numeral 9 denotes a mask having opening portions which are filled with cream solder, numeral 10 denotes a squeeze, numeral 14 denotes a gas charge/discharge pipe and numeral 32 denotes a cover. This publication fails to show how the internal pressure is controlled under the state in which the cover 32 is fitted containing the squeezee 10. However, in any case, in this method, since the internal pressure above the mask is not limited to the opening portions filled with the cream solder but to the entire portion of the mask, the mask 9 is deformed downwardly as shown in FIG. 7B. Assuming that the cream solder filled in the opening portions of the mask 9 is all pushed out at the same rate at the opening portions, a height of the tip end of the cream solder extruded from the opening portions of the mask 9 varies depending upon the place corresponding to the deformation of the mask 9.

The cream solder pushed into the opening portions by the squeezee 10 is bonded with a weak adhesive force. In order to normally print the cream solder onto a workpiece, the cream solder has to be transferred under the bonded condition with the adhesive force. When the separation rate of a workpiece 1 and the mask 9 is suitable for the central portion of the mask 9, the separation rate is increased at the peripheral portion of the mask 9 corresponding to the warpage of the mask 9 by the extruding rate of the cream solder. Therefore, the solder is cut causing the extruded cream solder following the cut to be poor. On the other hand, when the separation rate between the workpiece 1 and the mask 9 is suitable for the peripheral portion of the mask 9, since the separation rate at the central portion of the mask 9 is decreased corresponding to the warpage of the mask 9 by the extruding rate of the cream solder, the cream solder is buckled to stick to the bottom surface of the mask 9. The cream solder sticking to the mask 9 causes a fault. Thus, according to this method, it is impossible to applying the cream solder uniformly to the entire surface of the mask 9.

SUMMARY OF THE INVENTION

Accordingly, the present invention have made an improvement to a structure in which, a lower surface is provided on a pressure head, and holes corresponding to opening portions of the mask are arranged in the lower surface so that a pressure of gas may be applied only to cream solder filled in the opening portions of the mask. The inventors have found that the cream solder having a high ratio between a height of the cream solder and a diameter of the cream solder (hereinafter referred to as an aspect ratio of the cream solder) may be printed on the workpiece without deforming the mask 9.

In view of the foregoing finding, an object of the present invention is to provide a cream solder printing apparatus and a printing method therefor that may print the cream solder at a predetermined position of the workpiece stably even in case of a mask having a high aspect ratio of the opening portion, a mask having a fine diameter (opening area) of the opening portions and a mask having a wide printing area. Also, since the transferability and the printing plate removal property are in tradeoff relation in the cream solder in some cases, another object of the present invention is to use a cream solder having other properties such as the transferability enhanced by reducing the printing plate removal property.

In order to attain these and other objects, according to the present invention, there is provided a cream solder printing apparatus comprising: a positioning means for positioning a workpiece, a mask means composed of a mask having a plurality of opening portions, a filling means for filling cream solder in the opening portions, a pressurizing means composed of a pressure head having a pressure container and a gas charge/discharge pipe, a position registration means for aligning the workpiece, the mask and the pressure head, and a moving means for peeling the mask away from the workpiece, wherein a lower surface of the pressure head has holes at positions corresponding to the opening positions, such as when the pressure head is aligned with the mask, the holes align with the opening portions.

Also, in the cream solder printing apparatus, it is characterized in that an aspect ratio of the opening portions is in the range of 0.3 to 3.

In order to attain those and other objects of the present invention, according to the present invention, there is provided a cream solder printing method for performing a print with a cream solder by using a mask at a predetermined portion of a workpiece, comprising the following steps of: positioning the workpiece and/or the mask in place, performing registration of opening portions formed in the mask with the predetermined portion of the workpiece, filling the opening portions with the cream solder, performing registration of the opening portion filled with the cream solder with holes formed corresponding to the opening portions at a lower surface of a pressure head, pressurizing the cream solder filled in the opening portions while increasing an internal pressure within the pressure head, peeling the mask away from the workpiece, and moving the workpiece on which the cream solder has been printed to a next process.

Also, in the cream solder printing method, it is characterized in that the internal pressure within the pressure head for extruding the cream solder filled in the opening portions is in the range of 0.002 to 1 kg/cm$^2$.

BRIEF DESCRIPTION OF THE DRAWINGS

In the accompanying drawing:

FIGS. 2A and 2B are side and front elevation views, respectively, showing a pressure head moving mechanism according to an embodiment of the present invention;

DETAILED DESCRIPTION OF THE PREFERRED EMBODIMENTS

An embodiment of the present invention will now be described with reference to the accompanying drawings.

Figure 1:
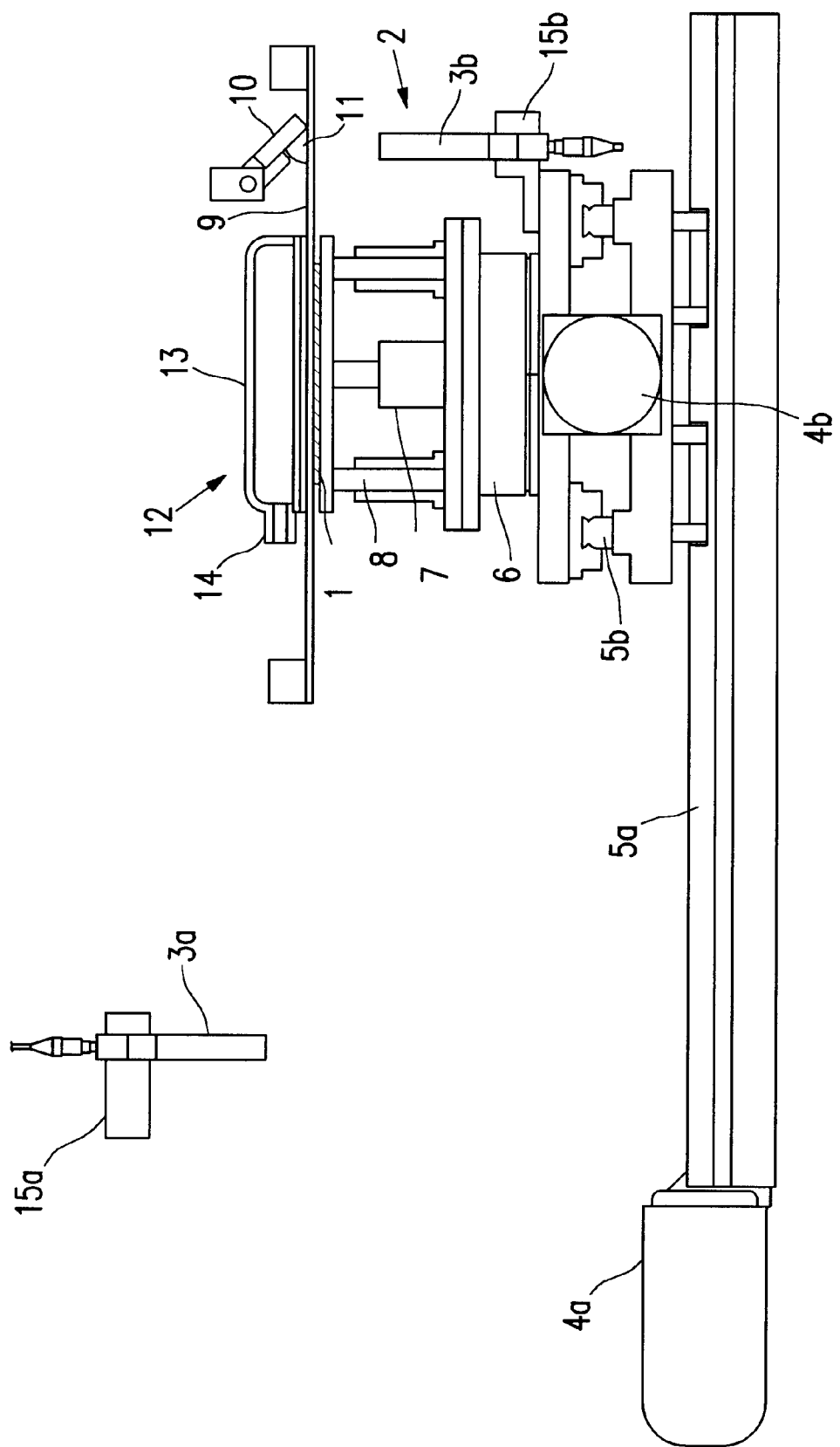
FIG. 1 is a frontal view showing a cream solder printing apparatus according to an embodiment of the present invention.

FIG. 1 shows a primary part of a cream solder printing apparatus in accordance with the embodiment of the present invention. The explanation will be given in conjunction with FIG. 4. The cream solder printing apparatus shown in FIG. 1 is composed of a workpiece positioning mechanism, a mark position measuring mechanism, a printing mechanism and a pressure head mechanism.

The workpiece positioning mechanism is composed of an XYZθ table 2 for positioning the workpiece 1. The XYZθ table 2 is composed of an X table, a Y table and a θ table and a Z table. The rotation of the X table and Y table is conventional into a linear motion by a ball screw nut of servomotors 4a and 4b with encoders so that the X table and Y table are moved along and on linear rails 5b and 5b, respectively. The θ table 6 is installed in the XY table so that it may take any desired angular rotational angle by a servomotor with an encoder (not shown). The Z table is provided on the θ table 6 and may be shifted in the Z direction by an air cylinder 7 and guide posts 8. The movement range of the XYZθ table 2 is set up so as to include a position when at least the workpiece 1 and the mask 9 may be recognized by a camera 3a and a camera 3b.

The mark position measuring mechanism is composed of the camera 3a and camera 3b. The camera 3a is a CCD camera fixed to a post (not shown) through a fixture member 15a for recognizing a mark provided on the workpiece 1.

Also, the camera 3b is fixed to the XY table through a fixture member 15b. The camera 3b is a CCD camera for recognizing a mark of a bottom surface 27 of a pressure head 12 and a printing mask 9. The workpiece 1 or the camera 3b is moved and the mark is recognized by a mark recognizing circuit so that the identified position becomes the position of the mark.

The printing mechanism is composed of the printing mask 9, a mask moving device (not shown), a squeezee 10 and a squeezee drive device (not shown). A cream solder 11 is fed from a cream solder feed device (not shown) and filled in the opening portions 31 (see FIGS. 6A and 6B) of the mask 9 by the squeezee 10.

The pressure head mechanism is composed of a pressure head 12, a pressure head moving mechanism (see FIG. 2A and 2B), a compressor 44, a regulator 43, valves 46 and 47 (see FIG. 4) and a gas charge/discharge pipe 14. Also, holes 28 or 30 corresponding to the opening portions 31 of the mask 9 are formed in the lower surface (or bottom wall) 27 or 29 of a pressure container 13 (see FIGS. 3A and 3B). Here, "corresponding to" means that the holes 28 or 30 are disposed in relative positions such that if the pressure 12 is aligned with the mask 9, the holes 28 or 30 will align with the opening portions 31. The gas charge/discharge pipe 14 is arranged in aside surface of the pressure container 13. The valves 46 and 47, the pressure regulator 43 and the compressor 44 for the charge/discharge of the gas including a leakage are connected to the gas feed/discharge pipe 14.

FIGS. 2A and 2B show the pressure head moving mechanism. FIG. 2A is a side elevational view and FIG. 2B is a frontal view. A gate-shaped frame 16 is composed of two posts 17a and 17b, a base 18 and an upper base 18. The base 18 extends forwardly from the posts 17a and 17b and an XYZθ table 20 for the pressure head 12 is arranged on the base 18.

The pressure head 12 is fixed to the Z table. Furthermore, when the pressure head 12 presses the mask 9 or comes into contact with the mask 9, in order to avoid the extra load to the mask 9, a counter balance mechanism is assembled into the Z table. This counter balance mechanism is used to take a balance of a weight of parts that are moved together with the pressure head 12 by a plurality of springs 21. A spring constant of a spring 21 is determined so that the springs 21 and the weight of the parts that move together with the pressure head 12 are balanced when a gas pressure of the air cylinder is set at zero (atmospheric pressure).

Since the pressure head 12 is counterbalanced in its gravitational weight, its step position is readily changed by an outside force. An upper limit (not shown) and a lower limit (not shown) define the movement range of the pressure head 12.

Parts or the whole pressure head 12 may be replaced whenever the type of the workpiece 1 is changed. Since the weight of the pressure head 12 is different in accordance with each type of machine, it is necessary to adjust and replace the springs 21 whenever the pressure heads 12 are replaced. It takes time to replace the springs 21 and to perform the positional adjustment of the lower surface 27 of the pressure head 12 concomitant with the replacement. In order to overcome this disadvantage, strong springs 21 are used to depress the pressure head 12 to the upper limit while predicting the upper limit weight of the pressure head 12 and the like in advance. In order to counterbalance the pressure head 12 depressed against the upper limit and to lift it, the pressure head 12 is depressed back downwardly at the force of about 1 to 4 kg by an air cylinder 22. If the pressure head 12 is kept under such a condition, it is possible to depress the pressure head 12 against the mask 9 without imparting an extra load to the mask 9. Inversely, in the same manner, a mechanism may be effectively used in which the pressure head 12 is depressed against the lower limit by the springs and is depressed back upwardly by the air cylinder 22.

Furthermore, in the case of the mechanism in which the pressure head 12 is depressed against the upper limit or the lower limit by the air cylinder without providing any springs 21, if the Z coordinate position of the pressure head 12 is correctly controlled, there is no fear that the extra load would be imparted to the mask 9 when the pressure head 12 is depressed against the mask 9. With such a mechanism, the change of the coordinate due to the thermal expansion is periodically corrected to thereby correctly control the Z coordinate position.

On the other hand, with the structure using the pressure head 12 whose gravitational weight is counterbalanced, unless the pressure head 12 is clamped at a predetermined force when the pressure head 12 is accelerated or decelerated for movement, the pressure head 12 would vibrate. In order to prevent the vibration of the pressure head, the counterbalanced pressure head 12 is depressed against the lower limit by the air cylinder 22 and fixed thereto. A depression force less than 1 kg can not completely prevent the generation of the vibration and on the other hand, a depression force exceeding 100 kg is not desirable in view of the mechanism. The depression force is preferably in the range of 1 to 20 kg and more preferably in the range of 2 to 10 kg. Furthermore, as the clamp method of the pressure head 12, in addition to the method in which the pressure head is depressed against the lower limit, it is possible to adopt a method in which the pressure head 12 is depressed against the upper limit or a method in which the pressure head 12 is fixed from the right side or the left side. In any case, the vibration prevention of the pressure head 12 may be attained effectively. After the movement of the pressure head 12 has been completed, the pressure head 12 is unclamped and is returned back to the position where it is counterbalanced by its gravitational weight.

A base vertical drive mechanism 24 for driving the base 18 up and down is added to the gate-shaped frame 16. The base vertical drive mechanism 24 is composed of a servomotor 25 with an encoder and a ball screw 26. This drive mechanism is used for a large amount of the vertical movement of the pressure head 12. Also, an ON/OFF point of an optical sensor generated when a beam of the optical sensor provided horizontally is traversed by the pressure head 12 is stored in a memory as a reference point in the Z direction of the pressure head 12. With such data, it is possible to perform the positioning of the pressure head 12. The base vertical drive mechanism 24 serves to retract the pressure head 12 in cooperation with the XYZθ table 20 so as not to collide with the squeezee 10 in addition to the function to move the pressure head 12 closer to the mask 9. However, since the apparatus temperature is changed and the reference point is changed during the operation, it is preferable to predict the correction value and to determined the correction method. Also, in the case where it is difficult to make a prediction, it is effective to correct the reference point and to correct the shift of the reference point at a constant operating cycle.

Figure 3A:
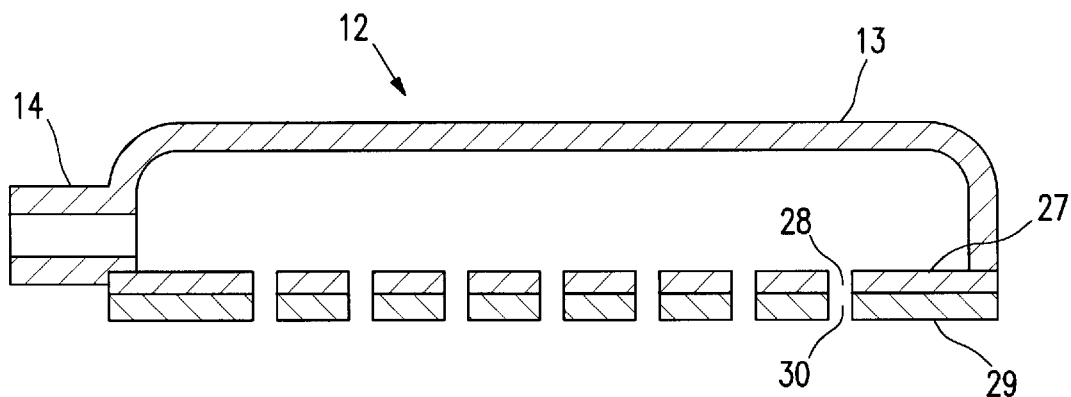
FIGS. 3A and 3B show a pressure head according to an embodiment of the present invention.
Figure 3B:
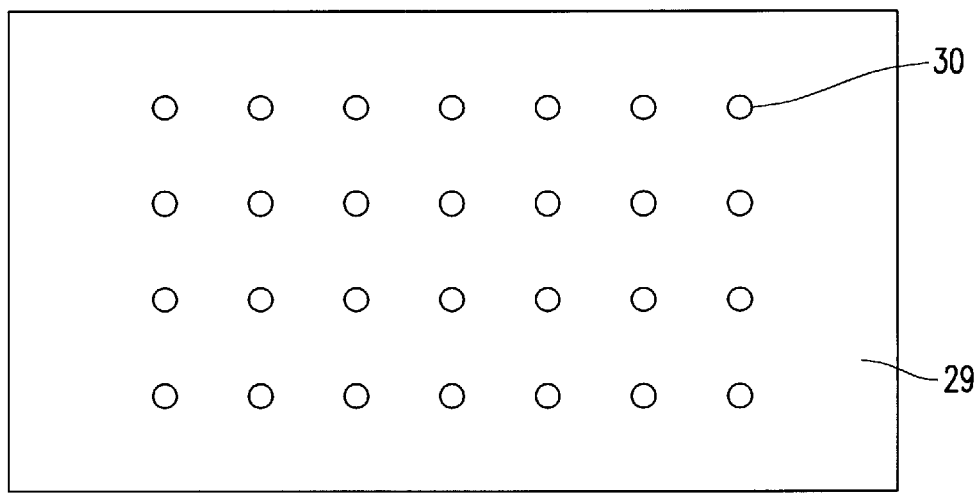
Figure 3C:
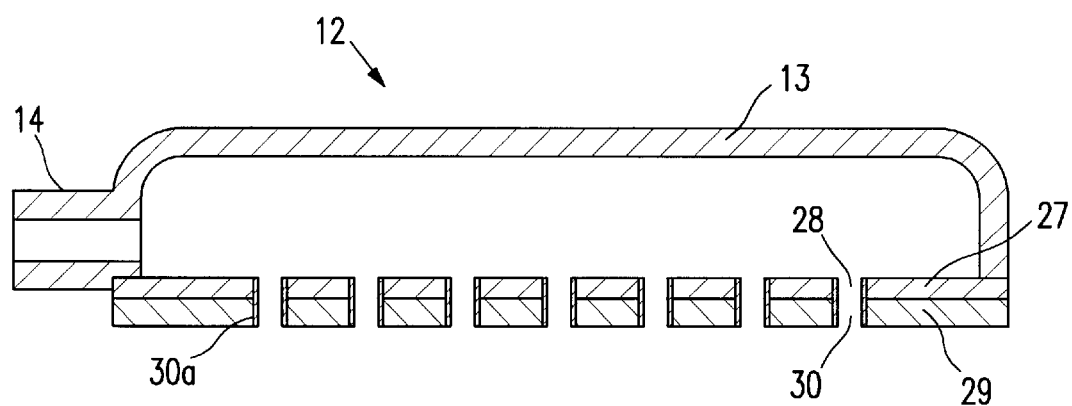
FIGS. 3C and 3D show a pressure head according to another embodiment of the present invention.
Figure 3D:
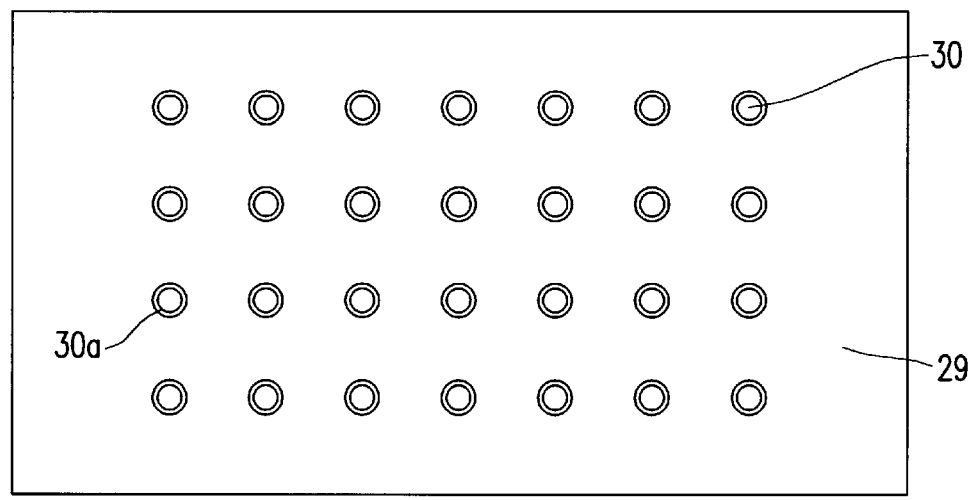

FIGS. 3A and 3B show an example of the pressure head 12. The explanation will be made in conjunction with FIGS. 6A–6E. The pressure container 13 has the gas feed/discharge pipe 14 and the lower surface 27. It is preferable to provide an elastic member 29 on the lower surface 27. Holes 28 and 30 are machined corresponding to the opening portions 31 of the mask 9 in the lower surface 27 and the elastic member 29. The elastic member 29 makes it possible to perform the soft elastic contact between the pressure head 12 and the mask 9 and at the same time, to prevent the leakage of the pressurized gas from an interface between the pressure head 12 and the mask 9 in the lateral direction. The holes 28 and 30 are designed to have a shape and a position such that, when the internal pressure of the pressure container 13 is increased, the internal pressure is applied only to the cream solder 11a filled in the opening portions 31 but not directly to the mask 9 and the mask 9 is hardly deformed by the internal pressure. If the size of the holes 28 and 30 is smaller than that of the opening positions 31 of the mask 9, it is likely that the extruding cream solder remained in the holes. On the other hand, if the size of the holes 30 is much larger than that of the opening portions 31 of the mask 9, the internal pressure is applied to the mask 9 to deform the mask 9. Accordingly, it is preferable that the size of the holes 30 (or 28) is 0.02 to 0.5 mm greater than that of the operating portions 31, and it is more preferable that the size is 0.05 to 0.2 mm greater than that of opening portions 31.

It is preferable to select, for the material of the lower surface 27, material having a rigidity such as stainless steel, brass, plastic or the like. In the case of the pressure head 12 having a large pressure area, it is preferable to select the thickness of the plate in the range of 0.5 to 5 mm and more preferable to select it not less than 1 mm in view of the difficulty in deformation. On the other hand, in the case of the pressure head 12 having a small pressure area, the thickness of the lower surface 27 is sufficient at 0.1 mm. When the internal pressure is applied under the condition shown in FIG. 6C, since the mask 9 except for the opening portions 31 is substantially covered by the lower surface 27 of the pressure container, the internal pressure is not applied directly to the mask 9 but the force to draw the mask 9 downwardly is applied due to the adhesive force and the viscosity of the cream solder. When the total area of the side walls of the opening positions 31 is increased, according to a condition, there is a possibility that the mask 9 and the pressure head 12 are separated away from each other. In the case where the downward draw force is small, it is possible to prevent the peel by the elastic force of the mask 9 and the elastic force of the elastic member 29. However, its range is limited.

A thin pipe 30a is embedded or a hollow portion is formed in the lower surface 27 of the pressure head 12 when the holes 28 and 30 are not formed, and furthermore, a communication path is provided so that the pipe or the hollow portion is in communication with the surface of the lower surface 27 of the pressure head 12 at a plurality of positions. If the pipe 30a is drawn under vacuum, it is possible to vacuum suck the mask 9 onto the lower surface 27 of the pressure head 12 by the communication path in contact with the mask 9 when the pressure head 12 is aligned with the mask 9. Thus, even if the internal pressure of the pressure head 12 is increased, there is no fear that the lower surface 27 of the pressure head 12 and the mask 9 are separated away from each other by the vacuum suction force.

When the vacuum is released after the cream solder is extruded, the mask 9 is separated away from the lower surface 27 of the pressure head 12. In the case where it is difficult to peel the mask from the pressure head 12, if the internal pressure is fed into the pipe 30a, it is possible to peel the mask 9 away from the lower surface 27 of the pressure head 12 with ease. A void space where electrodes are not arranged is present in the workpiece 1. Also, a void space is present between samples in the case where a number of the samples are printed together. It is preferable to provide the opening portion of the pipe 30a in a relative large void space so as to avoid the place where the holes 28 and 30 are concentrated. In the foregoing embodiment, the thin pipe 30a is embedded, but it is possible to obtain the same effect by using the holes or grooves instead of the pipe.

FIG. 3B is a view as viewed from the bottom of the pressure head 12. Reference numeral 29 denotes the elastic member and reference numeral 30 denotes holes corresponding to the opening portion 31 of the mask 9 in communication with the holes 28.

It is possible to use a support frame (not shown) of the mask drive mechanism having a cantilever style as shown in FIG. 2. However, it is preferable to use a frame structure having four posts because a load is applied when the squeeze 10 is operated. In the case where the workpiece 1 is aligned with the mask 9 and the mask 9 is aligned with the pressure head 12, the mask 9 is not moved every time but it is preferable to move the workpiece 1 and the pressure head 12 for more efficiency.

In the registration between the mask 9 and the workpiece 1, only the workpiece 1 is moved in the XYθ direction without moving the mask 9. Accordingly, it is sufficient to impart the function to move only in the Z axis to the mask drive mechanism. A squeegee drive mechanism performs the registration at the squeezee tip end at the GO and RETURN of the reciprocating motion of the squeezee and performs the filling operation in accordance with the standard for the cream solder 11 to he opening portions 31 of the mask 9. Furthermore, the squeezee drive mechanism has a function to cause the squeezee to stand by in the region where the squeezee 10 is out of contact with the mask 9 and the pressure head 12. Incidentally, in order to avoid the deformation of the mask 9, it is preferable that four sides of the mask 9 are fixed by a jig, respectively and a fixture mechanism is employed for applying a uniform tension to the mask 9 through the jig. Since a crack would be generated from the opening portions 31 to damage the mask 9 when its tension is too large, the magnitude of the tension is limited to the range where the mask 9 would not be damaged.

Figure 4:
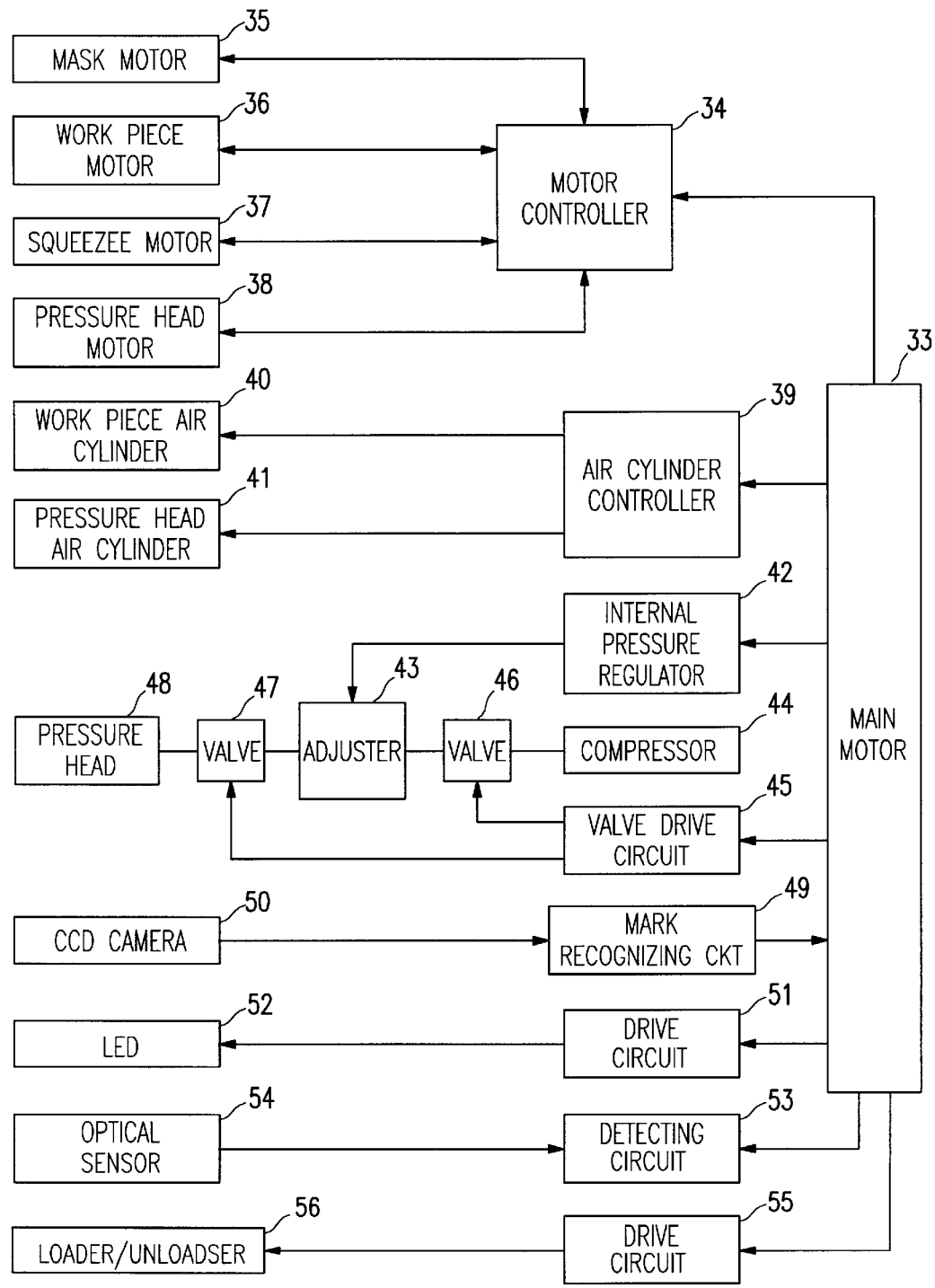
FIG. 4 is a control block diagram according to an embodiment of the present invention.

FIG. 4 is a block diagram of a main control of the cream solder printing apparatus in accordance with this embodiment.

A main controller 33 is composed of a basic processor, a main memory, a controller and an input/output processor and at the same time has a program for operating the cream solder printing apparatus for controlling a motor controller 34, an air cylinder controller 39, an internal pressure regulator circuit 42, a valve drive circuit 45, a mark recognizing circuit 49, a light emitting element drive circuit 51, an optical sensor detecting circuit 53 and loading/unloading drive circuit 55.

The motor controller 34 controls mask motor 35, a workpiece motor 36, a squeezee motor 37 and a pressure head motor 38. The workpiece motor 36 is composed of servomotors 4a and 4b with encoders for moving the workpiece 1 in the X and Y directions, and a servomotor (not shown) with an encoder for moving in the θ direction. The pressure head motor 38 is composed of a servomotor with an encoder for moving the pressure head in the X, Y and θ directions and servomotor 25 with an encoder for moving the pressure head in the Z direction.

The mask motor 35 is composed of a servomotor with an encoder for moving the mask 9 in the X, Y, Z and θ directions but in some cases, no motor is used for moving the mask in the X, Y and θ directions. The squeezee motor 37 is a servomotor with an encoder for moving the squeezee 10 in the X, Y and Z directions. The air cylinder controller 39 controls a workpiece air cylinder 40 (corresponding to reference numeral 7 in FIG. 1) and a pressure head air cylinder 41 (corresponding to reference numeral 22 in FIG. 2).

The valve controlling circuit 45 controls the valves 46 and 47 for charge/discharge of the gas. A leak valve (not shown) is included in each valve 46, 47. The internal pressure regulator circuit 42 controls a pressure and a flow rate of the gas to be fed by the adjuster 43 and adjusts the internal pressure of the pressure head 12. A CCD camera 50 is composed of a camera 3a and a camera 3b. The mark recognizing circuit 49 using the recognizes two marks provided diagonally of the workpiece 1 by the camera 3a and measures their coordinates, and further recognizes two marks provided diagonally of the mask 9 and two marks provided diagonally of the pressure head lower surface 27 and 29 by the camera 3b and measures the respective coordinates.

The detecting circuit 53 detects a beam emitted horizontally from the light emitting element 52 with an optical sensor 54. The detecting circuit 53 detects the Z position where the beam is turned on/off, by the vertical movement of the mask 9 or the pressure head 12 and uses the Z coordinate corresponding to that position as a standard point in the Z axis. The drive in the Z direction may be performed in a teaching method by using these reference points. The drive circuit 55 drives and controls the loader and the unloader of the workpiece 1.

Figure 5:
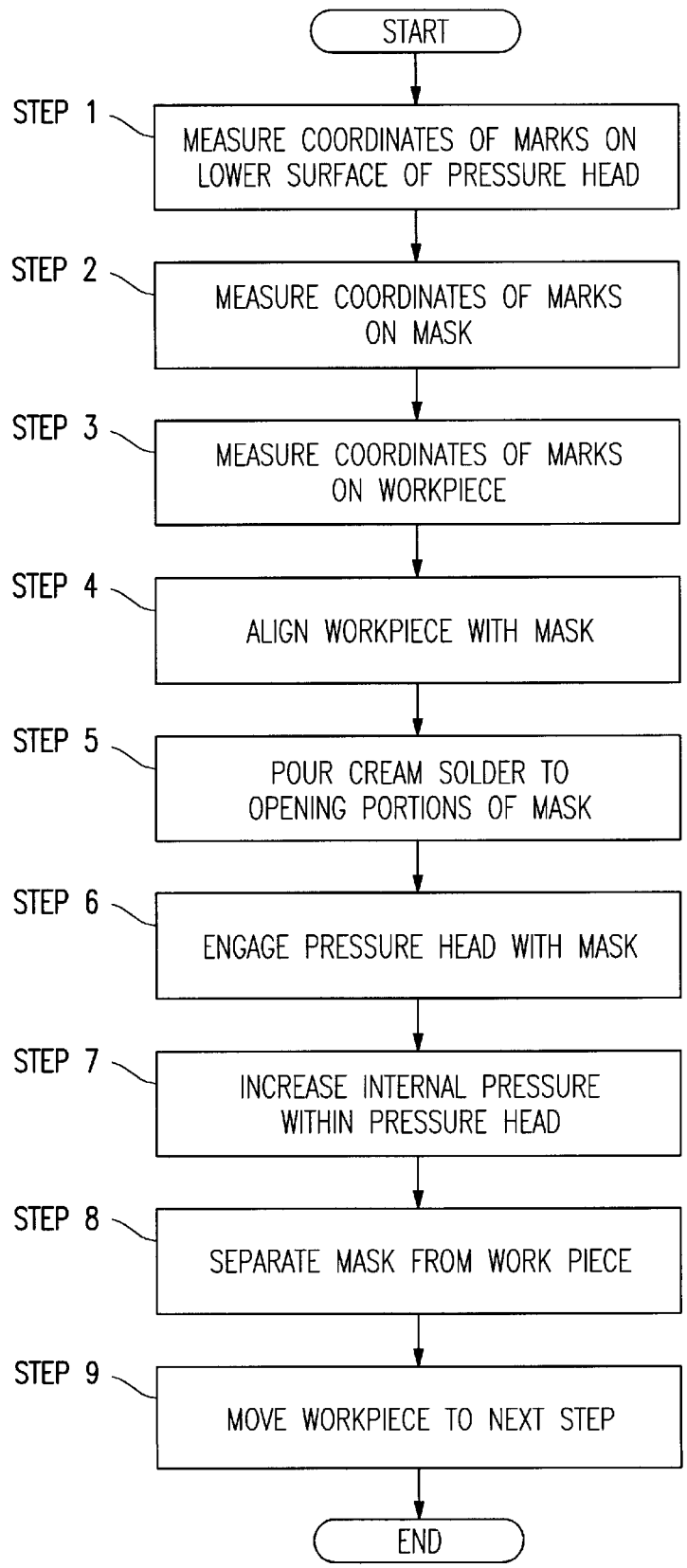
FIG. 5 shows a flowchart of a cream solder printing process according to an embodiment of the present invention.

FIG. 5 shows an example of a flowchart in a printing method in accordance with the cream solder printing apparatus shown in FIG. 1.

In step 1, under the condition that the mask 9 is retracted in FIG. 1 or is not provided, the camera 3b is moved below the pressure head 12 by the XYZθ table 2, the two marks provided on the lower surface of the pressure head 12 are taken as a group of the coordinate data, the identification between the taken mark data and the bit data set up in advance is recognized and the coordinates when identified are stored in the main controller 33 as the coordinates of the mark. In step 2, under the condition that the pressure head is retracted upwardly, the camera 3b is moved by the XYZθ table 2, the mask is set up in a predetermined position, the two marks provided in the mask 9 are recognized by the camera 4b, and in the same manner, the coordinates of the marks are stored in the main controller.

In step 3, the workpiece 1 is moved below the camera 4a by the XYZθ table 2, the two marks provided on the workpiece 1 are recognized by using the camera 4a and in the same manner, the coordinates are stored in the main controller.

In step 4, the movement distance of the workpiece 1 is calculated by using the coordinates of the marks provided on the work piece 1 and the coordinates of the marks provided on the mask 9, the XYZθ table 2 is driven to align the workpiece 1 with the mask 9. The positional registration between the workpiece 1 and the mask 9 is performed by data into which incorporated are a difference between the marks provided in the workpiece 1 and the predetermined portions of the workpiece 1 on which the cream solder is printed and a difference between the marks provided on the mask 9 and the coordinates of the opening portions 31 corresponding to the above-described predetermined portions. In step 4, the opening portions 31 of the mask 9 are identified with the predetermined positions of the workpiece 1 on which the cream solder is to be printed. Then, the mask 9 is lowered relative to the workpiece 1 down to the position where the cream solder is to be printed. In this case, the mask 9 and the workpiece 1 may be in intimate contact with each other, or may be kept apart at a small clearance. This operation may be performed by raising the workpiece 1 relative to the mask 9.

In step 5, while holding the cream solder 11 on the squeezee 10, the squeezee 10 is moved on and along the mask 9 to fill the cream solder 11 into the opening portions 31 of the mask 9. Since the cream solder 11 has a thixotropy, if the squeezee 10 is moved fast, insufficient filling is likely to occur in the opening portions 31 of the mask 9. Accordingly, the squeezee 10 is moved at a relatively gentle rate. The moving speed of the squeezee 10 is in the range of 0.005 to 0.04 m/s. If 0.05 m/s is exceeded, a gap is generated within the opening portions 31 of the mask 9, and if the speed is less than 0.001 m/s, the workability becomes worse. The squeezee angle is in the range of 20 to 60 degrees, and the rolling diameter of the cream solder 11 is in the range of 5 to 25 mm for squeeze.

In step 6, the moving distance is calculated from the coordinates of the marks measured in step 1 and step 2, respectively, and the holes 28 and 30 provided in the lower surfaces 27 and 29 of the pressure head 12 are moved to the corresponding positions of the opening portions 31 of the mask 9 by the XYZθ moving table 2. In the case where it is confirmed that the squeezee 10 is in the position where it is out of contact with the pressure head 12 and the marks are positioned in different registration positions in the same manner as in step 4, the pressure head 12 is in registration with the mask 9 in the same manner with the corrected data of the difference. In this step, the holes 28 and 30 of the lower surface 27 of the pressure head 12 are identified with the corresponding opening portions 31 of the mask 9. Then, the pressure head 12 is moved to a position that it may depress the cream solder 11a filled in the opening portions 31 of the mask 9. In this case, the mask 9 and the workpiece 1 may be raised relative to the pressure head 12.

When the internal pressure is to be applied, the positional relationship between the pressure head 12 and the mask 9 may be either in low pressure contact with each other or in contact with each other. In the case where the soft elastic member 29 is laminated on the lower surface 27 of the pressure head 12, when the pressure head 12 is lowered within the range of 1 mm after the contact and the pressure head 12 is elastically depressed against the mask 9, it is advantageous that the pressure head 12 is hardly peeled off from the mask 9 and at the same time, it is possible to prevent the leakage of gas even if the internal pressure is increased.

In step 7, the valves 46 and 47 are opened to adjust the pressure and the flow rate of the gas to increase the internal pressure within the pressure head 12. The suitable internal pressure differs depending upon the composition and thixotropy of the mean solder and the shape of the opening portions 31. However, in the case where the internal pressure is higher than the atmosphere pressure by less than 0.001 kg/cm$^2$, the extrusion takes too long, and if 2 kg/cm$^2$ is exceeded the extruding rate of the cream solder is too fast so that the extruded cream solder could not take a predetermined shape. Accordingly, the internal pressure is in the range of 0.002 to 1 kg/cm$^2$. More preferably, the range is from 0.005 to 0.2 kg/cm$^2$.

In step 8, while separating the workpiece 1 away from the mask 9 by the air cylinder 7 of the ZYXθ table 2, the cream solder 11a is extruded onto the workpiece 1 by the pressure of the gas. Since the optimum peeling rate is largely change depending upon the characteristics of the cream solder, the lowering speed of the workpiece 1 is to be controlled in conjunction with the internal pressure. Incidentally, it is possible to take a method in which step 8 is taken without increasing the internal pressure in step 7 and the internal pressure is increased when the workpiece 1 and the mask 9 begin to peel away from each other. The optimum extrusion time is determined by the relationship between the internal pressure and the depth of the opening portions. However, since the cream solder 11 has the thixotropy, the low speed extrusion makes it possible to stabilize the shape more after the cream solder 11a has been extruded. Also, the relationship between the intensity of the internal pressure and the time may be insured by a method where constant pressure is kept from the initial stage to the last stage of the pressurization. However, in view of the productivity, it is preferable that the pressure is high in the initial stage but low in the final stage at 0.001 kg/cm$^2$.

With the extrusion time of less than 0.1 seconds, the extrusion rate of the cream solder 11 is too high, it is difficult to control the peeling rate between the mask 9 and the workpiece 1 and when the time period of 20 seconds is exceeded, the productivity becomes worse. It is therefore preferable that the period of time for extrusion is in the range of 0.1 to 20 seconds. It is more preferable, depending upon the amount of the extrusion, that the extrusion time period is in the range of 0.5 to 5 seconds. Since the cream solder 11 may readily be caused to flow when the extrusion begins so that the viscosity thereof is lowered, the method where the internal pressure is lowered once the extrusion is started is regarded as a good method for effectively utilizing the thixotropy of the cream solder. If the fluidization of the cream solder is started, even if the internal pressure is set at 50% of the initial value, it is possible to extrude the cream solder without degrading the productivity. Also, when the cream solder is extruded from the opening portions 31 of the mask 9, the contact area between the opening portions 31 and the cream solder is decreased. Accordingly, the force generated by the viscosity of the cream solder for lowering the mask 9 is decreased. The contact area is used as a function to thereby control the internal pressure so that the cream solder may be extruded in a predetermined shape.

In step 9, the workpiece 1 on which the cream solder 11a is printed is moved to the next step, and at the same time, the pressure head 12, the mask 9 and the XYZθ table 2 are returned back to their original positions. Since the coordinate data of the marks are stored by the operations in steps 1 and 2, for the second cream solder printing onward, it is possible to dispense with the steps 1 and 2 and to start from the step 3. Before starting step 1, the cream solder residual sticking in the lower surface 29 of the pressure head 12 and the mask 9 is to be cleaned periodically by paper or cloth containing cleanser.

The next step following step 9 is an inspection step for inspecting whether the cream solder 11a is printed onto the workpiece 1 in accordance with the operation standards or a reflow step for reflowing the cream solder 11a in the case where the above-described inspection is not conducted. The belt width of the reflow furnace is a belt width such that the workpieces 1 are usually inserted in a row. However, in order to reduce the length of the reflow furnace, the width of the belt of the reflow furnace may be increased so that the workpieces 1 may be processed in a plurality of rows, and it is preferable that a distributor for distributing into a plurality of rows of the workpieces 1 where the cream solder is printed is disposed before the reflow furnace so that the workpieces 1 are distributed in a plurality of rows to be fed to the reflow furnace. When a plurality of rows of the workpieces 1 (for example, two) are used, it is possible to reduce the length of the reflow furnace to one half. Since the pressure head is used so that the extrusion time of the cream solder 11 is reduced, the number of the workpieces 1 to be fed into the reflow furnace per unit time is increased. Accordingly, the method using the distributor for reflow by the plurality of rows is effective in reducing the installation area of the reflow furnace. It is apparent that the method for distributing the workpieces 1 into the plurality of rows and for feeding them into the reflow furnace is effective in a solder ball loading method and a mechanism using no pressure head 12. Also, in the electrodes of the workpiece 1 where the cream solder is to be printed, metal is exposed in the region when the cream solder is to be printed but the other region is covered by insulating material. The exposed metal and the cream solder have a good wettability whereas the insulating substance and the cream solder have a bad wettability. Accordingly, the reflow solder is self-aligned by its own surface tension to the exposed electrodes when the solder is in reflow. The shape of the reflow solder is formed into a convex shape such as an arcuate shape, a semi-sphere, a sphere with a cutaway or the like in accordance with the increase of volume of the printed solder. It is one of the features of the present invention that the shape of spherical convex may be provided.

FIGS. 6A, 6B, 6C, 6D and 6E schematically show a typical positional relationship among the workpiece 1, the mask 9, the squeezee 10, the pressure head 12 and the cream solder 11 in the printing process of the cream solder.

Figure 6A:
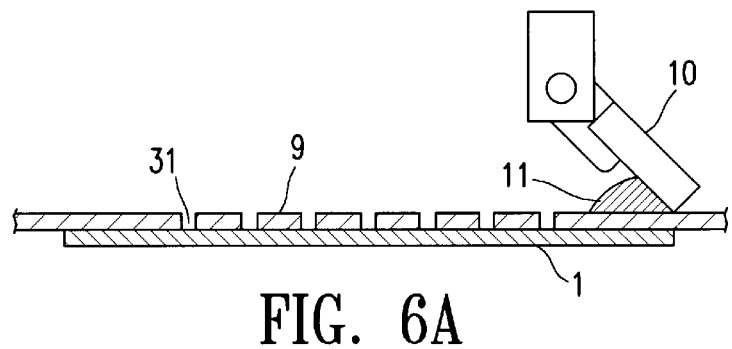
FIGS. 6A–6E are schematic views showing the printing process according to an embodiment of the present invention.
Figure 6B:
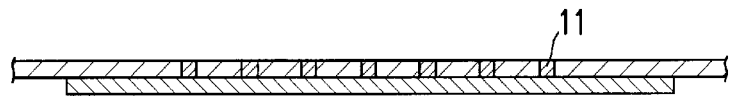
Figure 6C:
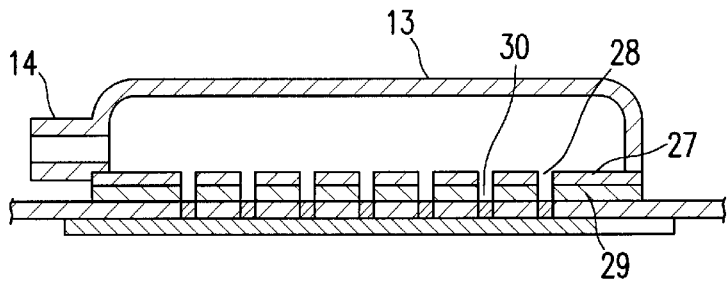

FIG. 6A shows a state where the workpiece 1 and the mask 9 are aligned in position corresponding to step 4 immediately before the filling operation of the cream solder 11 to the opening portions 31 of the mask 9 by the squeezee 10. FIG. 6B corresponds to step 5 where the cream solder 11 has been filled in the opening portions 31 of the mask 9. FIG. 6C corresponds to steps 6 and 7 where the holes 28 and 30 of the pressure head 12 are in registration with the opening portions 31 of the mask 9 and the pressure head 12 and the mask 9 are engaged with each other.

Figure 6D:
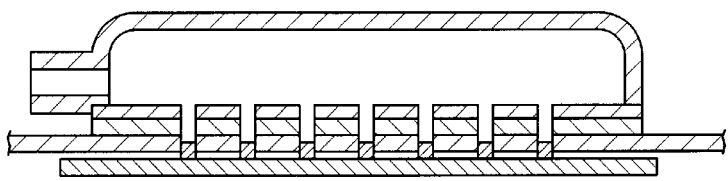
Figure 6E:
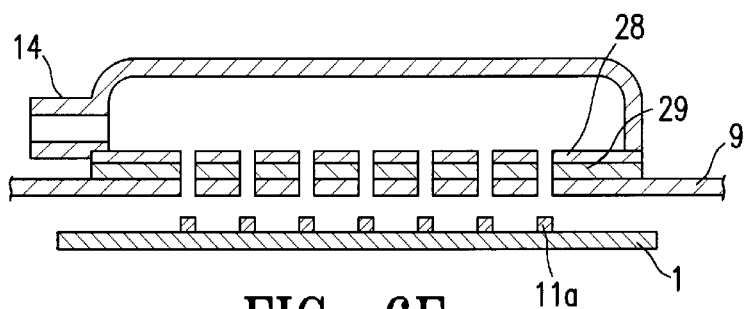
Figure 7A:
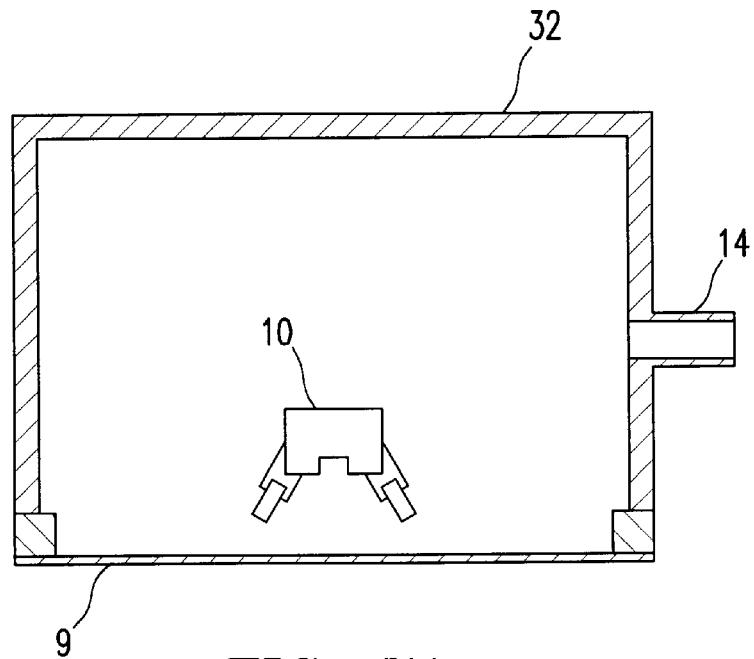
FIGS. 7A and 7B show a conventional cream solder printing method.
Figure 7B:
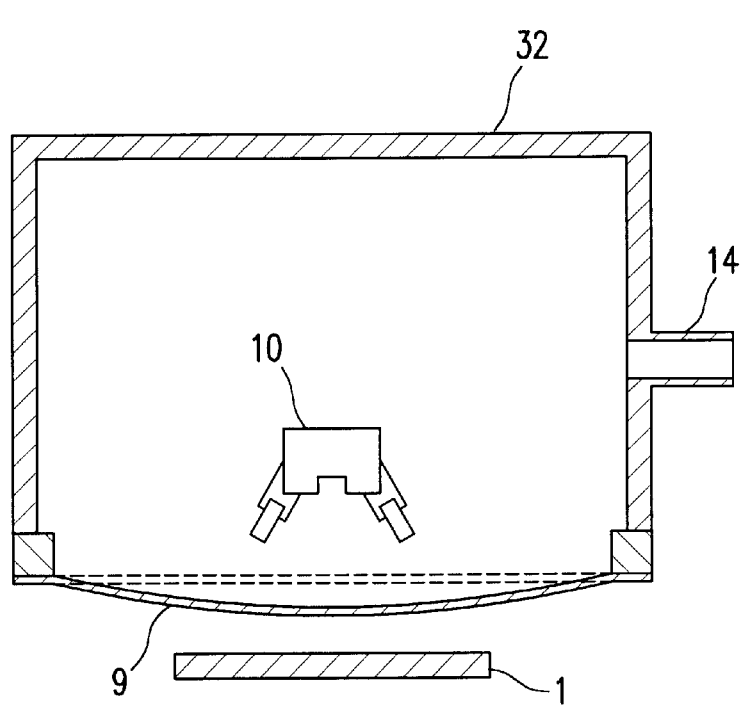

FIG. 6D shows a stage where the workpiece 1 is separated from the mask 9 while applying the internal pressure. FIG. 6E shows the state where the cream solder 11a has been completely extruded in the latter half of step 8. If the internal pressure is increased, it is possible to perform the printing with a rather high aspect ratio of the cream solder 11a. However, the upper limit of the aspect ratio of the opening portions at which it is possible to stably fill the cream solder by the squeezee 10 is three, and the upper limit of the cream solder that may be printed is three. However, if a dispenser is used in the filling means of the cream solder 11, it is possible to raise the upper limit of the aspect ratio to the range of 5 to 10. When the dispenser is used in the filling means, the aspect ratio of the printable cream solder is determined mainly by the aspect ratio of the machinable opening portions 31 and is considerably increased. In view of this, it is apparent that the aspect ratio of the cream solder to be extruded is not limited to a specific one according to the present invention.

The composition of the cream solder 11 in this embodiment is composed of Sn-Pb co-crystal alloy powder, RMA, activator, thixotropy agent and solvent. The alloy powder may be Sn-Pb alloy, low temperature Sn-Pb alloy, lead-free Sn alloy and gold alloy. According to the present invention, since the cream solder having a large aspect ratio may be printed, it is possible to use the present method instead of the solder ball mounting method or the stud bump method. Furthermore, it a cream gold solder is used, it is possible to gold form bump corresponding to the conventional gold bump in accordance with the gold ball mounting method or the gold bump forming method. The cream gold solder has a co-crystal composition of Au-Si 6% or a composition containing a fine amount of particle of gold. The mask having the opening portions 31 of the aspect ratio 0.2 and 3 and the above-described cream gold solder are used in the printing method in the cream solder printing apparatus in accordance with this embodiment to thereby from the gold bump. Incidentally, a convex shape is suitable for the bump, and it is preferable that the aspect ratio of the opening portions 31 is 0.5 or more. On the other hand, even if the cream solder is an electrically conductive adhesive, it is possible to form the convex conductive substance on the electrodes of the workpiece 1. The electrically conductive adhesive is a paste in which fine particles having a conductivity such as carbon, silver, gold, copper, nickel or the like is mixed into a binder having a high density and a high viscosity. The cream solder according to the present invention includes the above-described material.

The masks in accordance with this embodiment may be marks that have been used to the surface mounting. The shape is square, regular triangular, circular, diagonal, or the like. For example, the length of one side of the square shape is 1.0 mm. Incidentally, the positions of the marks are two, respectively. However, it is possible to use a sub-mark and use a service mark, a sign or a letter put on a workpiece 1, a mask 9 and the present head 12 as a mark.

The gas use in the present invention inclusive of the above-described embodiment is nitrogen gas or air. It is preferable that the humidity of the gas is low in under to prevent the oxidation of the cream solder. The feed source of the gas is a pressurized tank, a liquefied gas tank, a compressor or the like. Also, the elastic member 29 may be selected from synthetic rubber such as silicone rubber, fluorine rubber, SBR or the like. However, the material is not limited to a specific one if the material has elasticity.

The mask 9 in accordance with the present invention inclusive of the above-described embodiment is a stainless steel plate in which the opening portions 31 are formed by a laser machining technique or a nickel alloy according to an additive method. In order to enhance the printing plate removal property, it is effective to provide a taper to the side surface of the opening portions, to finish the side surface of the opening portions in a mirror surface or to coat water repulsive resin such as a fluorine resin onto the mask 9 including the side surface of the opening portions. These methods considerably enhance the printing plate removal property in combination with the embodiment for extruding the solder by the pressure of gas. According to the present invention, the diameter of the opening portions 31 of the mask 9 is in the range of 10 to 50 microns in the case of the smaller one, in the range of 100 to 500 microns in the case of the medium one and in the range of 600 to 1,000 microns in the case of the larger one. Also, the number of the opening portions 31 formed in the mask 9 is hundred in the smaller case, in the range of 200 to 3,000 in the medium case and in the range of 4,000 to 20,000 in the larger case.

Nickel alloy or stainless steel that is ferromagnetic is used for the mask 9 and the magnetically excited coil is provided within the pressure head 12 so that the mask 9 and the pressure head 12 may be magnetically coupled with each other. When the mask 9 and the pressure head 12 are magnetically coupled with each other, even if the internal pressure of the pressure head 12 is increased, it is possible to keep the mask 9 under almost no deformed condition. Subsequently, if the magnetic excitation of the magnetically excited coil is stopped, it is possible to release the mask 9 away from the pressure head 12 with ease. If the ferromagnetic material is used for the mask 9, the above-described advantages may be enjoyed.

As the workpiece 1 to be printed is increased, the area of the mask 9 and the number of the opening portions 31 are increased. In the case of the mask 9 where 5,000 opening portions 31 are formed, if the thickness of the mask 9 is 0.15 mm and the area of the mask 9 exceeds 70×120 mm, the warpage of the mask 9 is increased by the viscosity of the cream solder in some cases. In those cases, the difference in extrusion rate of the cream solder is generated between the central portion and the end portion of the mask 9 and between the former half and the rear half of the extrusion process of the cream solder by the warpage of the mask 9. This is not preferable because the shape of the extruded cream solder is non-uniform.

The force given to the mask 9 by the viscosity of the cream solder is a product of the contact area between the mask 9 and the cream solder and the viscosity per unit area of the cream solder. In the case where the cream solder having a large viscosity per unit area is used, the present invention maybe extensively used by using the vacuum suction of the pressure head 12 nd the mask 9 and the magnetically attraction in combination.

As described above, according to the present invention, it is possible to ensure the following advantages. Namely, the arrangement is taken in which the lower surface having the holes corresponding to the opening portions of the mask is provided on the pressure head and only the cream solder inserted into the opening portions of the mask is pressurized and extruded so that the cream solder having a large aspect ratio may be printed.

The structure is taken in which the lower surface having the holes corresponding to the opening portions of the mask is provided on the pressure head so that only the cream solder filled in the opening portions is pressurized whereby even if the cream solder having a poor printing plate removal property is used, it is possible to print the cream solder by using the mask having the aspect ratio of 0.3 to 3.

Also, according to the method of pressurizing only the cream solder filled in the opening portions of the mask and extruding the cream solder by the gas, it is possible to print the cream solder having the high aspect ratio. Furthermore, by setting the internal pressure of the pressure head from 0.002 to 1 $kg/cm^2$, even if the cream solder has a poor printing plate removal property, it is possible to print the cream solder having the high aspect ratio.

Also, according to the present invention, it is possible to perform the print with the cream solder having a fine area for fine pitch electronic parts and to perform the print with the cream solder filled in the opening portions distributed in a wide area to enlarge the characteristic range of the cream solder that is usable for the print.

It will be apparent to those skilled in the art that various modifications and variations can be made in the cream solder printing apparatus and method of the present invention without departing from the spirit or scope of the inventions. Thus, it is intended that the present invention cover modifications and variations of this invention that come within the scope of the appended claims and their equivalents.

What is claimed is:

1. A cream solder printing apparatus comprising:
   a workpiece positioning mechanism for positioning a workpiece;
   a mask having a plurality of opening portions forming a pattern;
   a filling device for filling cream solder in the opening portions;
   a pressure head having a pressure container and a gas charge/discharge pipe;
   a moving mechanism for peeling the mask away from the workpiece; and
   a control device for aligning the workpiece, the mask and said pressure head so that the mask is interposed between the pressure head and the workpiece, and for print the cream solder filled in the opening portions of the mask on the workpiece using the pressure head;
   wherein the pressure head has a bottom wall defining a plurality of holes disposed at position corresponding to the positions of the opening portions of the mask, such that when the pressure head is aligned with the mask, the holes on the lower surface of the pressure head align with the opening portions of the mask.

2. The cream solder printing apparatus of claim 1, wherein an aspect ratio of the opening portions of the mask is between about 0.3 to about 3.

3. The cream solder printing apparatus of claim 1, wherein the pressure head includes an elastic member mounted on the bottom wall of the pressure head, the elastic member defining a plurality of holes aligned with the holes on the bottom wall, wherein when elastic member is interposed between the mask and the bottom wall when the pressure head is aligned with the mask.

4. The cream solder printing apparatus of claim 1, wherein sizes of the holes on the bottom wall are the same or larger than the sizes of the corresponding opening portions in the mask.

5. The cream solder printing apparatus of claim 1, wherein the bottom wall of the pressure head is made of a rigid material.

6. The cream solder printing apparatus of claim 1, wherein the pressure head includes at least one thin pipe embedded in the bottom wall, the thin pipe being the flow communication with an outside surface of the bottom wall of the pressure head at a plurality of positions.

7. The cream solder printing apparatus of claim 1, wherein the bottom wall of the pressure head has at least one groove in an area free of holes.

8. A pressure head used in a cream solder printing apparatus, the cream solder printing apparatus including a mask defining a plurality of opening portions, the pressure head comprising:
   a pressure container having a first surface defining a plurality of holes, the holes being disposed at a positions corresponding to the positions of the opening portions of the mask, such that when the pressure head is aligned with the mask, the holes on the lower surface of the pressure head align with the opening portions of the mask; and
   a gas charge/discharge pipe connected to the pressure container for regulating a pressure inside the pressure container.

9. The pressure head of claim 8, wherein the pressure head includes an elastic member mounted on the bottom wall of the pressure head, the elastic member defining a plurality of holes aligned with the holes on the bottom wall, wherein when elastic member is interposed between the mask and the bottom wall when the pressure head is aligned with the mask.

10. The pressure head of claim 8, wherein sizes of the holes on the bottom wall are the same or larger than the sizes of the corresponding opening portions in the mask.

11. The pressure head of claim 8, wherein the bottom wall of the pressure head is made of a rigid material.

12. The pressure head of claim 8, further comprising at least one thin pipe embedded in the bottom wall, the thin pipe being in flow communication with an outside surface of the bottom wall of the pressure head at a plurality of positions.

13. The pressure head of claim 8, wherein the bottom wall of the pressure head has at least one groove in an area free of holes.

14. A cream solder printing method for printing cream solder on a predetermined portion of a workpiece, comprising:

aligning a mask having a plurality of opening portions with the predetermined portion of the workpiece;

filling the plurality of opening portions in the mask with cream solder;

aligning the opening portions filled with the cream solder with a pressure head, the pressure head having a bottom wall defining a plurality of holes disposed at positions corresponding to the opening portions of the mask, wherein the opening portions are aligned with the holes;

pressurizing the cream solder filled in the opening portions by increasing an internal pressure within the pressure head; and peeling the mask away from the workpiece.

15. The cream solder printing method according to claim 14, wherein the internal pressure within the pressure head in the pressurizing step is between about 0.002 to about 1 $kg/cm^2$.

* * * * *